United States Patent
Palanduz et al.

(10) Patent No.: US 7,081,650 B2
(45) Date of Patent: Jul. 25, 2006

(54) INTERPOSER WITH SIGNAL AND POWER SUPPLY THROUGH VIAS

(75) Inventors: Cengiz A. Palanduz, Chandler, AZ (US); Nicholas Holmberg, Gilbert, AZ (US); Dong Zhong, San Jose, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/403,312

(22) Filed: Mar. 31, 2003

(65) Prior Publication Data

US 2004/0188826 A1 Sep. 30, 2004

(51) Int. Cl.
H01L 27/108 (2006.01)
H01L 29/76 (2006.01)
H01L 29/94 (2006.01)
H01L 31/119 (2006.01)

(52) U.S. Cl. .................... 257/310; 257/774
(58) Field of Classification Search ............. 257/310, 257/774
See application file for complete search history.

(56) References Cited

U.S. PATENT DOCUMENTS

| | | | |
|---|---|---|---|
| 3,401,126 A | 9/1968 | Miller et al. | 252/514 |
| 3,429,040 A | 2/1969 | Miller | 29/626 |
| 4,153,988 A * | 5/1979 | Doo | 29/827 |
| 4,328,530 A * | 5/1982 | Bajorek et al. | 361/762 |
| 4,360,142 A | 11/1982 | Carpenter et al. | 228/123 |
| 4,882,650 A * | 11/1989 | Maher et al. | 361/321.4 |
| 5,048,744 A | 9/1991 | Chang et al. | 228/123 |
| 5,501,893 A | 3/1996 | Laermer et al. | 428/161 |
| 5,774,326 A | 6/1998 | McConnelee et al. | 361/313 |
| 5,786,238 A | 7/1998 | Pai et al. | 438/118 |
| 6,034,332 A | 3/2000 | Moresco et al. | 174/255 |
| 6,102,710 A | 8/2000 | Beilin et al. | 439/67 |
| 6,184,476 B1 | 2/2001 | Takahashi et al. | 174/261 |
| 6,195,249 B1 | 2/2001 | Honda et al. | 361/306.3 |
| 6,477,034 B1 | 11/2002 | Chakravorty et al. | 361/306.3 |
| 6,507,497 B1 | 1/2003 | Mashino | 361/767 |
| 6,836,020 B1 * | 12/2004 | Cheng et al. | 257/774 |

FOREIGN PATENT DOCUMENTS

| JP | 2001015654 A | 1/2001 |
|---|---|---|
| JP | 2001134743 A | 5/2001 |

* cited by examiner

*Primary Examiner*—Howard Weiss
(74) *Attorney, Agent, or Firm*—Schwegman, Lundberg, Woessner & Kluth, P.A.

(57) ABSTRACT

A planar thin film multi-layer capacitor having a high dielectric constant with a plurality of conductive through vias and a plurality of pairs of conductive through vias having a low dielectric constant and operating in a transverse electromagnetic wave mode for high frequency signals on the pairs of vias. Vias coupled to the capacitor are arranged to propagate alternate polarity. The interposer is adapted for coupling directly to a die.

19 Claims, 10 Drawing Sheets

INTERPOSER WITH SIGNAL AND POWER SUPPLY THROUGH VIAS

FIELD OF THE INVENTION

The present subject matter relates to integrated circuit device packaging and, more particularly, to an interposer structure with through vias for signal communication and through vias for power delivery.

BACKGROUND

The electrical current demands of a high-speed microprocessor sometimes generate unacceptably large reductions in voltage, often called voltage droops. To ameliorate excessive voltage droops, decoupling capacitors are sometimes placed on the substrate at the processor die. Typical, the decoupling capacitors are discrete components that introduce undesirable inductance, thus degrading the performance of the capacitors.

In addition, the signal lines of a high-speed microprocessor are susceptible to degradation of signal integrity arising from excessive delay, cross talk with adjacent high-density vias and other losses.

DETAILED DESCRIPTION

Figure 1:
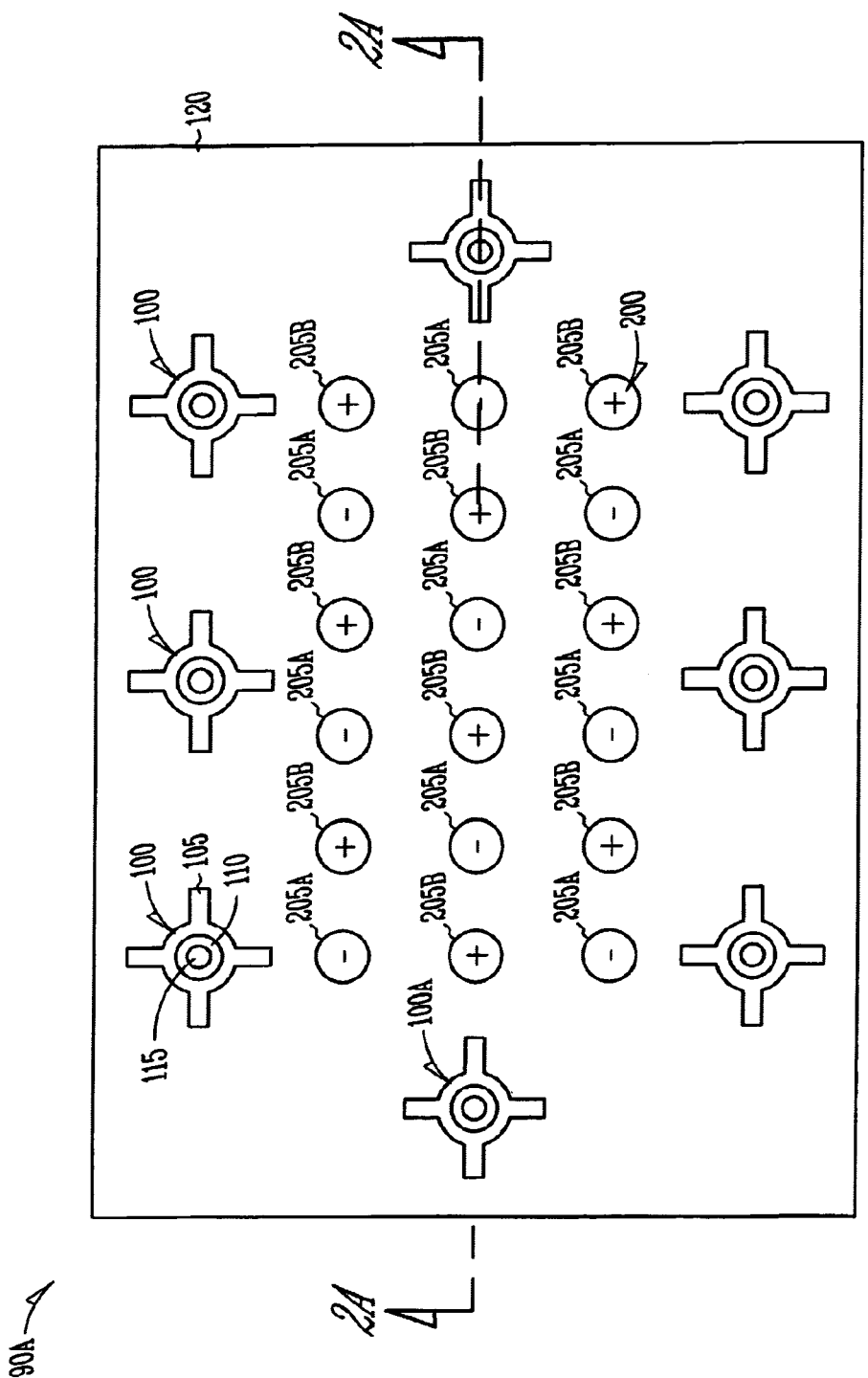
FIG. 1 includes a top plan view of an interposer according to the present subject matter.

In the following detailed description, reference is made to the accompanying drawings which form a part hereof, and in which is shown by way of illustration specific embodiments in which the invention may be practiced. These embodiments are described in sufficient detail to enable those skilled in the art to practice the present subject matter, and it is to be understood that the embodiments may be combined, or that other embodiments may be utilized and that structural, logical and electrical changes may be made without departing from the spirit and scope of the present invention. The following detailed description is, therefore, not to be taken in a limiting sense, and the scope of the present subject matter is defined by the appended claims and their equivalents. In the drawings, like numerals describe substantially similar components throughout the several views. Like numerals having different letter suffixes represent different instances of substantially similar components.

The present subject matter includes an interposer configured for placement between a die and a device or other structure. In one embodiment, the interposer is adapted for direct attachment between a die and a motherboard or other substrate. The die may include an integrated circuit die or a processor die. In one embodiment, the interposer is disposed between a first die and a second die.

FIG. 1 includes a top plan view of interposer 90A according to one embodiment. Interposer 90A, in the figure, includes array 200 of 18 power delivery vias. Each power delivery via includes a connection pad for coupling with a die or other circuitry. In one embodiment, when interposer 90A is coupled to a die and a substrate, the power delivery vias are powered in a pattern of alternate polarities. In the figure, nine vias 205A are denoted as having a negative polarity and nine vias 205B are denoted as having positive polarity. The polarity of each power delivery via is determined by the die or circuitry to which interposer 90A is coupled. In the embodiment illustrated, the vias of array 200 are arranged in a grid such that adjacent vias are of opposite polarity. In the figure, the connection pads for each via are visible. Each connection pad is coupled to a via that provides an electrically conductive path between an upper side (shown) of interposer 90A and a lower side (not shown) of interposer 90A. Each via of array 200 passes through the substrate and one or more dielectric layers and conductive material layers. For each via, a connection pad or other connection structure is provided on the lower side of interposer 90A.

Power delivery vias, in one embodiment, convey power and ground, or other power supply node connections, for a die or other circuit. Power delivery vias are also suited for supplying decoupling capacitance to circuitry of the die or other circuit.

Power delivery vias may be disposed on interposer 90A in configurations or numbers other than that shown in the figure. For example, in one embodiment, power delivery vias are arranged in a single row. As another example, in one embodiment, power delivery vias are distributed about the periphery of a surface of the interposer. In one embodiment, all positive power delivery vias are physically grouped in a first region of the interposer and all negative power delivery vias are physically grouped in a second region of the interposer. In one embodiment, two through vias are provided on an interposer for power delivery.

In addition to the power delivery vias, interposer 90A includes a plurality of paired signal vias 100. As used herein, each paired signal via includes a first electrically conductive through via and a second electrically conductive through via. The figure illustrates, for each paired signal via 100, a first connector pad 115, dielectric 110 and second connector pad 105. First connector pad 115 and second connector pad 105 are coupled to through vias that provides electrically conductive paths between the upper side of interposer 90A and the lower side of interposer 90A. Dielectric 110 is disposed in a region between each through via of paired signal via 100.

In one embodiment, the vias of interposer 90A are fabricated of conductive metal or other conductive material. In one embodiment, the vias include copper. In various embodiments, the vias are fabricated by dry etching, wet etching or laser drilling that is subsequently plated or filled with conductive metal or material. The vias are positioned to match conductive pads of a corresponding die or other structure and extend, generally, through the plane of the interposer.

Interposer 90A, in one embodiment, includes an inorganic substrate. Examples of inorganic substrate materials include metal, glass, ceramic, semiconductor, an oxide of silicon and other materials. In one embodiment, interposer 90A includes a silicon-based substrate. Interposer 90A, in one embodiment, includes a conductive material and the conductive through vias are electrically isolated from interposer 90A by a layer of insulative material. Interposer 90A, in one embodiment, includes a nonconductive material.

Figure 2A:
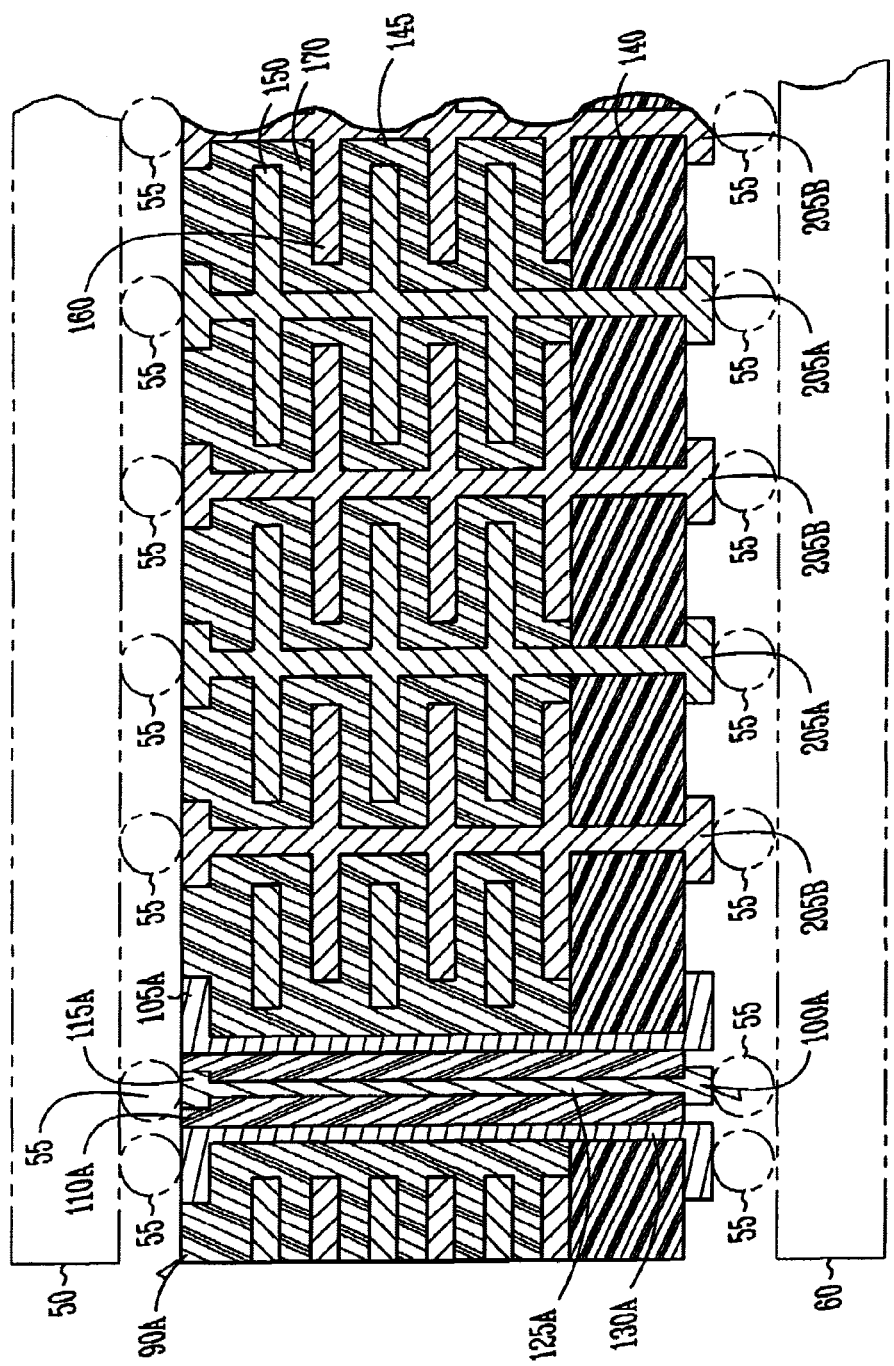
FIG. 2A includes a cross-sectional view taken along cut line 2A—2A of the subject matter illustrated in FIG. 1.

FIG. 2A includes a cross-sectional view of the structure denoted at cut line 2A—2A in FIG. 1. The figure also includes, in phantom lines, die 50 and structure 60, each electrically coupled to interposer 90A by a plurality of C4 (controlled collapse chip connection) bumps 55. In one embodiment, interposer 90A includes a pad grid array (PGA).

Die 50 may include an integrated circuit, processor, or other electrical device. In various embodiments, structure 60 includes a die, a motherboard, a substrate, a multi-chip module (MCM) or other structure having electrically conductive pads. According to one embodiment, the vias of interposer 90A are tailored to align with connection pads on the die for power delivery and signal propagation. In various embodiments, the interposer is adapted for bonding to the die side or land side of a die.

In one embodiment, multiple conductive paths through interposer 90A are coupled to each bump. For example, in an array of power delivery bumps, a plurality of parallel positive-side paths and a plurality of parallel negative-side current paths are provided through interposer 90A.

Interposer 90A includes through vias 205A and through vias 205B, each of which include a connector pad at an upper surface and a lower surface of interposer 90A. Interposer 90A includes multi-layer capacitor (MLC) 145 bonded to inorganic substrate 140. Multi-layer capacitor 145 includes a plurality of conductive plates aligned parallel with substrate 140. Alternate plates of capacitor 145 are electrically bonded to vias 205A and vias 205B. For example, capacitor plate 150, coupled to via 205A, is separated, or electrically isolated, from adjacent capacitor plate 160, coupled to via 205B, by a layer of dielectric 170. The plates of capacitor 145 are arranged in layers with each layer corresponding to a manufacturing process in fabricating capacitor 145. In one embodiment, a first half of the plates of capacitor 145 are electrically coupled to each via 205A and a second half of the plates of capacitor 145 are electrically coupled to each via 205B. In one embodiment, capacitor 145 includes a capacitor having two plates separated by a single layer of dielectric 170.

Dielectric 170, in one embodiment, has a relative dielectric constant, denoted as $\in_r$, of sufficiently high value to provide decoupling capacitance for die 50. In one embodiment, capacitor 145 provides a capacitance for a filter circuit of die 50 or structure 60. In one embodiment, vias 205A and 205B provide current paths for input/output signals. According to one embodiment, $\in_r$ for dielectric 170 is greater than approximately 50. In one embodiment, dielectric 170 has an $\in_r$ greater than 100.

In one embodiment, dielectric 170 includes perovskite (calcium titanium oxide) or other crystalline mineral. Dielectric 170, in one embodiment, includes a thin-film or thick-film dielectric layer deposited over a conductive plate. Dielectric 170, in various embodiments, includes tantalum pentoxide ($Ta_2O_5$), oxynitride film (SiONx film), barium titanate ($BaTiO_3$) or barium strontium titanate (BST) or other materials exhibiting high dielectric constant, also known as high-K, properties. In various embodiments, dielectric 170 is sputter deposited, anodically grown, deposited by chemical solution deposition (CSD) or deposited by chemical vapor deposition (CVD). In one embodiment, capacitor 145 is fabricated by alternately forming a patterned layer of conductive material and insulative material.

FIG. 2A also illustrates paired signal via 100A disposed through interposer 90A. In the figure, the concentric alignment of first via 125A and second via 130A is illustrated. In particular, a longitudinal axis of first via 125A is concentric, or coaxial, with a longitudinal axis of second via 130A. When paired signal via 100A is used to communicate high frequency signals, first via 125A and second via 130A can be electrically modeled as a transmission line operating in a transverse electromagnetic (TEM) mode. A high frequency signal may include a signal having a frequency of several gigahertz (GHz) or greater, however, lower frequencies are also contemplated. In one embodiment, first via 125A and second via 130A are aligned coaxially and adapted to transmit a signal at high frequency with low losses. The configuration of paired signal via 100A, in one embodiment, permits signal propagation with reduced dielectric losses, low loss tangent, reduced cross-talk and matched impedance. A region between first via 125A and second via 130A includes dielectric 110A. Dielectric 110A, in one embodiment, has an $\in_r$ sufficiently low to allow operation in TEM mode. For example, in one embodiment, dielectric 110A has $\in_r$ of approximately 4. In one embodiment, the ratio of the high-k dielectric constant to the low-k dielectric constant is greater than 25:1. In one embodiment, dielectric 110A includes a silica-based film. In one embodiment, dielectric 110A includes a porous or nanoporous silica (silica aerogel/xerogel). In one embodiment, the low dielectric constant material has a dielectric constant lower than, or equal to, that of silicon dioxide.

Connector pad 115A is disposed on a first end of first via 125A and connector pad 105A is disposed on a first end of second via 130A. In one embodiment, the second end of first via 125A and the second end of second via 130A includes connector pads or other structure for electrically coupling.

Paired signal via 100A, in one embodiment, is adapted to communicate an input/output (I/O) signal. The I/O signal may be a digital or analog signal, a balanced signal, a signal plus a ground or other signal. In one embodiment, signal via 100A is adapted to propagate power delivery.

Figure 2B:
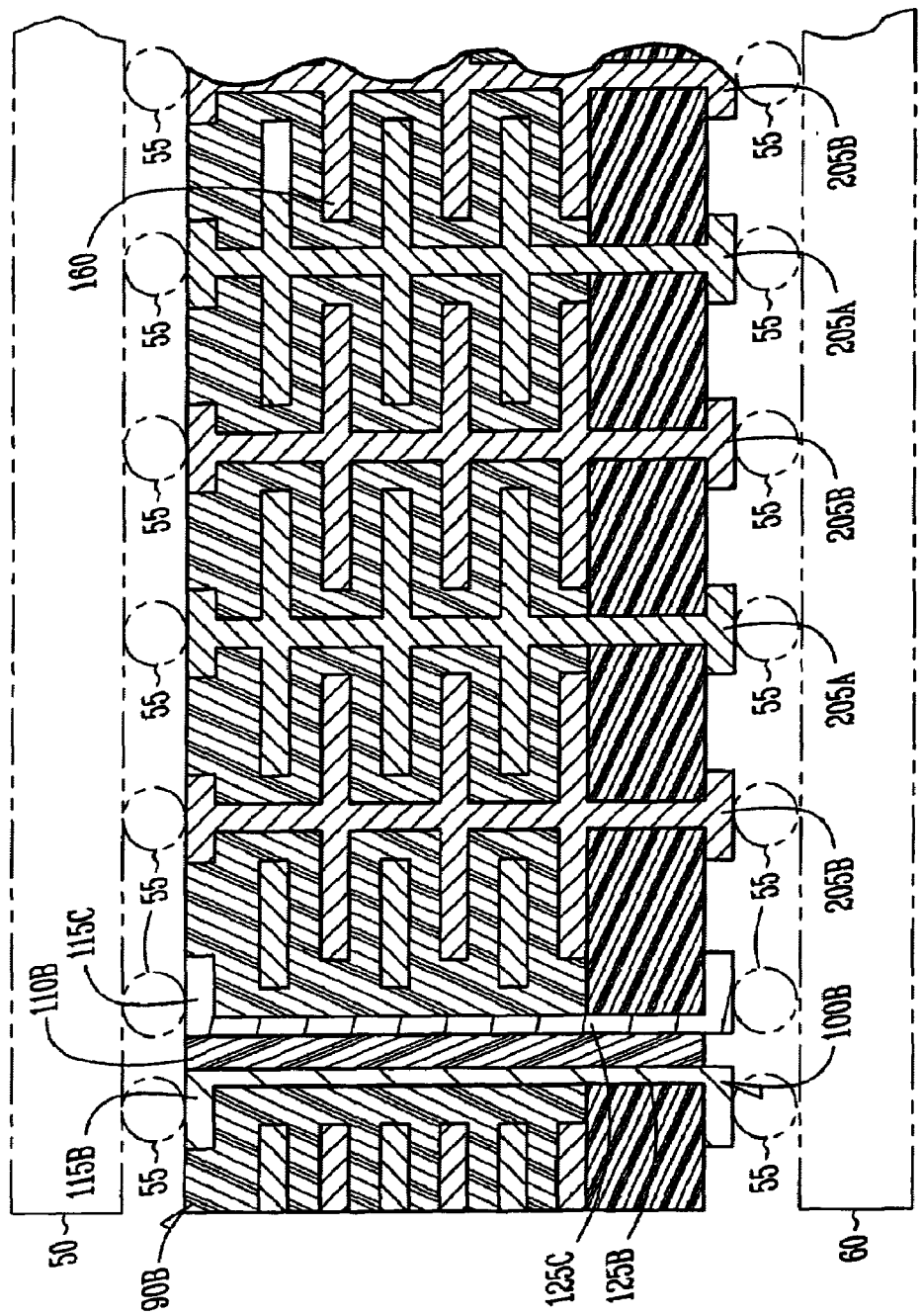
FIG. 2B includes a cross-sectional view of one embodiment.

FIG. 2B illustrates a portion of one embodiment of interposer 90B. In the figure, interposer 90B includes a plurality of power delivery vias 205A and 205B. In addition, interposer 90B includes paired signal vias 100B having first via 125B and second via 125C. First via 125B and second via 125C are parallel and adjacent conductors and can be modeled as a transmission line. A region between first via 125B and second via 125C includes dielectric 110B. Dielectric 110B, in one embodiment, has an $\in_r$ sufficiently low to allow operation in TEM mode.

Connector pad 115B is disposed on a first end of via 125B and connector pad 115C is disposed on a first end of via 125C. In one embodiment, the second end of first via 125B and the second end of second via 125C includes connector pads or other structure for electrically coupling. In various embodiments, connector pads 115B and 115C are rectangular or circular in cross-section.

Figure 3:
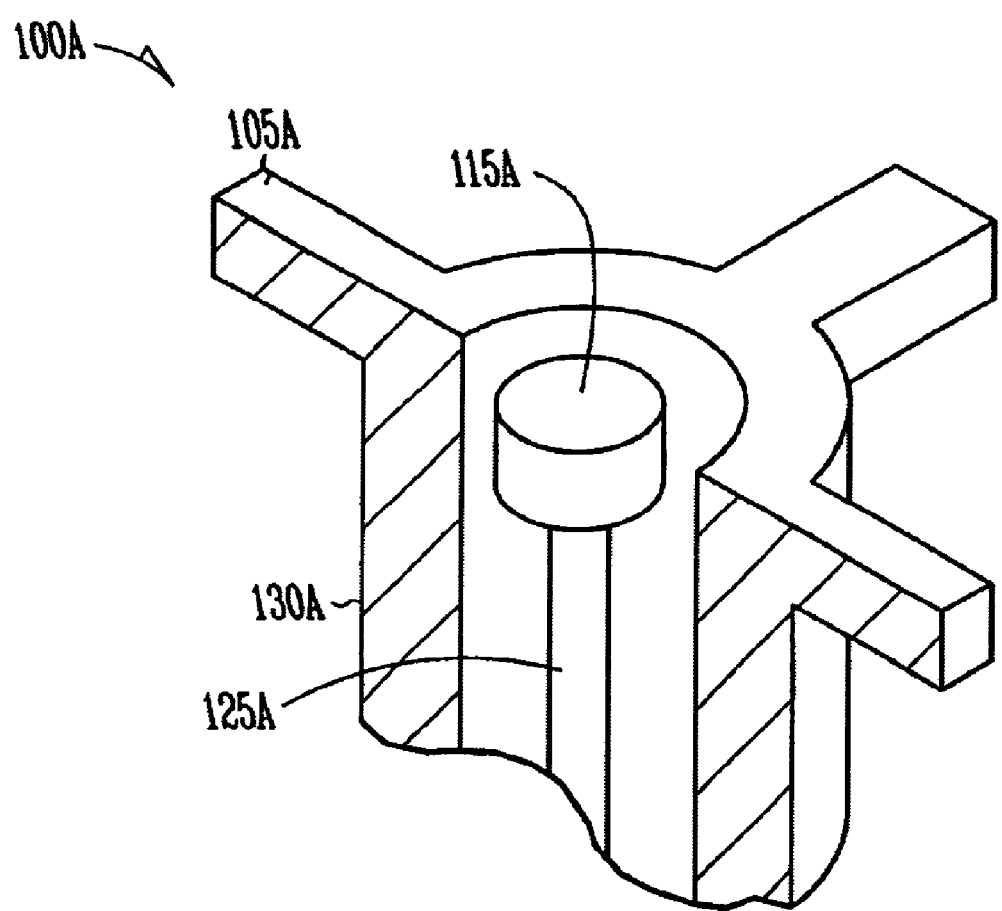
FIG. 3 includes a perspective view of a portion of a signal via according to one embodiment.

FIG. 3 illustrates a perspective view of paired signal via 100A according to one embodiment of the present subject matter. In the figure, a portion of via 130A is shown in cross-section, a portion of via 125A is shown in full, and a dielectric between the vias is omitted for clarity. Via 130A includes connector pad 105A having four bonding surfaces arranged in a cross configuration on both the upper and lower surface of the interposer. The figure illustrates a partial view of two bonding surfaces and a complete bonding surface in the rear. Connector pad 115A has a circular shape and is concentric with through via 125A.

Figure 4:
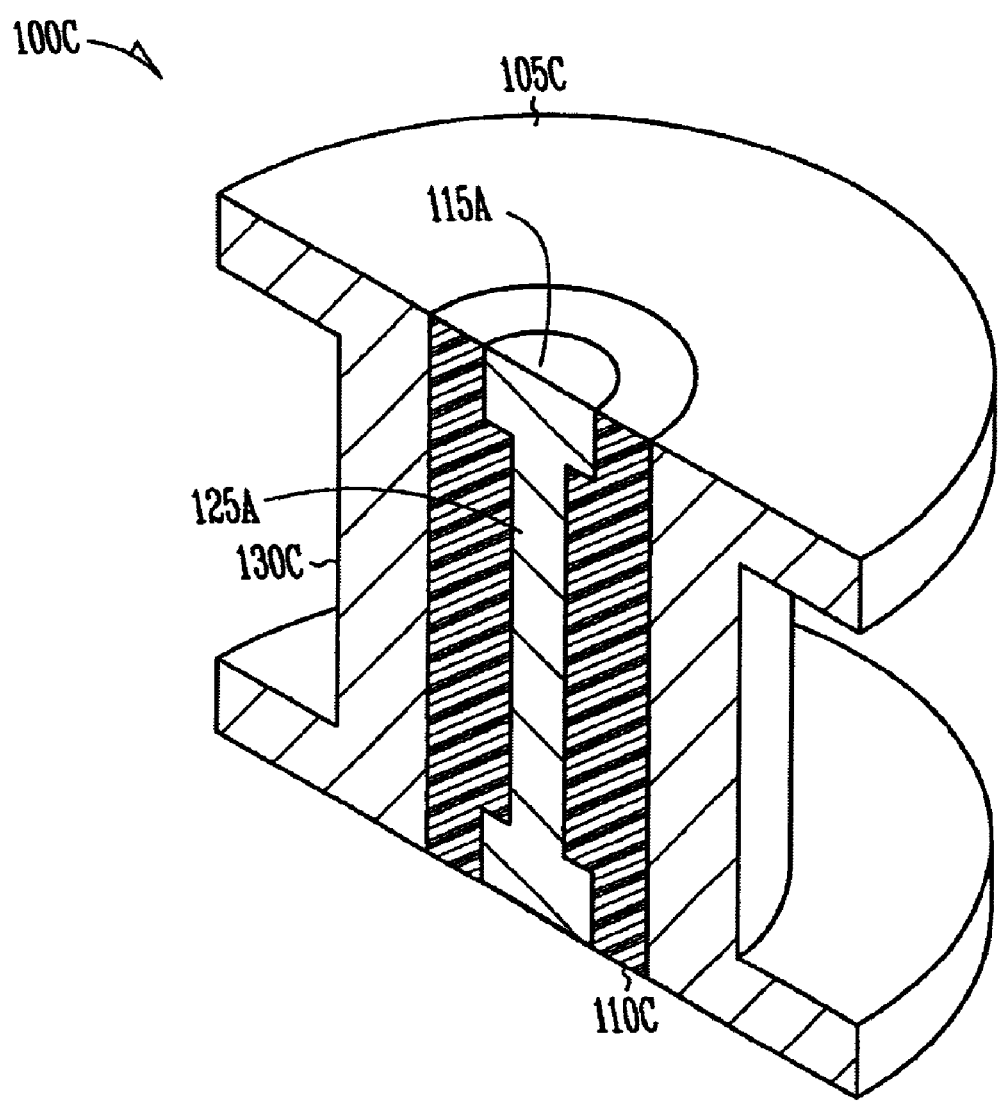
FIG. 4 includes a cross-section view of a portion of a signal via according to one embodiment.

FIG. 4 illustrates a cross-section view of paired signal via 100C according to one embodiment of the present subject matter. In the figure, via 130C and via 125A are coaxially aligned with dielectric 110C disposed between the vias. In one embodiment, via 130C is fabricated by plating the interior wall of a bore in the interposer with a conductive material. Connector pad 105C, disposed on both ends of via 130C, is disk shaped.

Figure 5:
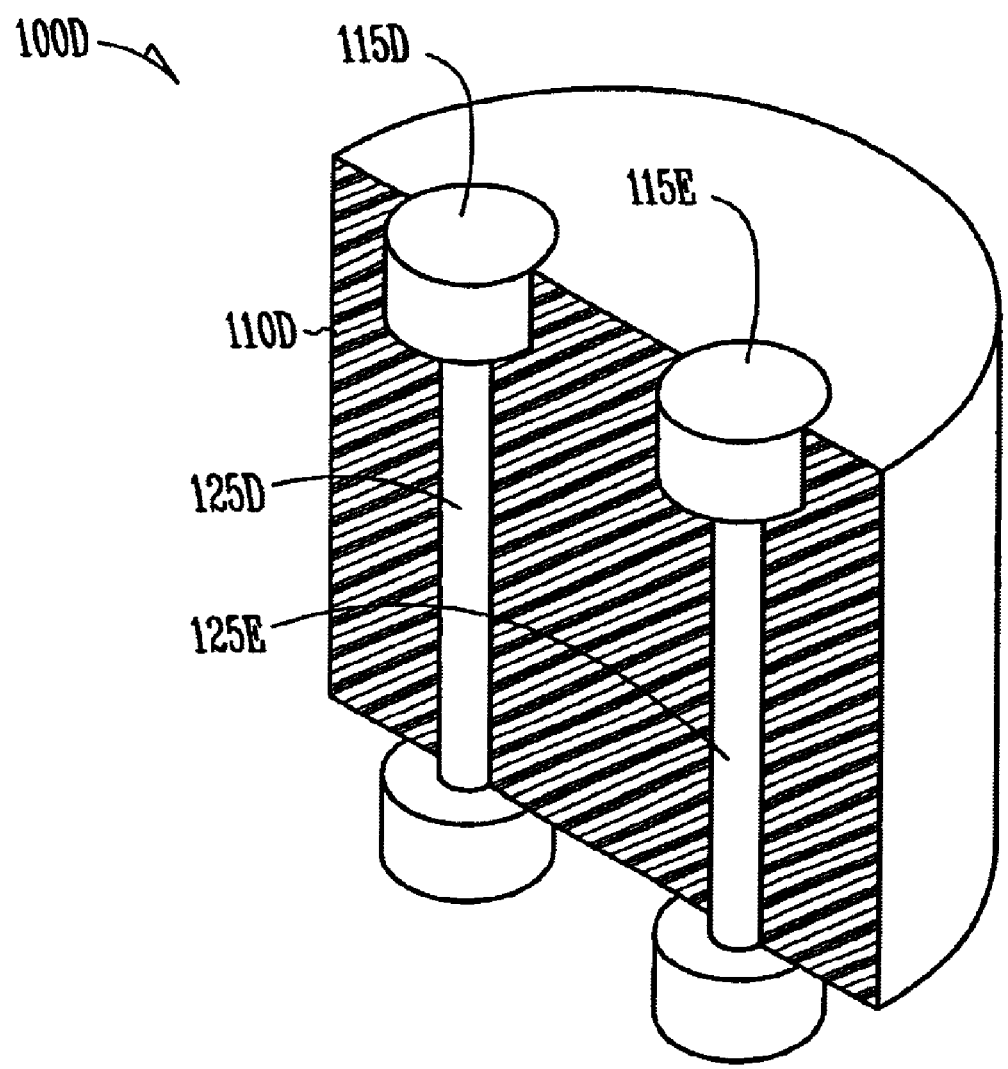
FIG. 5 includes a cross-section view of a portion of a signal via according to one embodiment.

FIG. 5 illustrates a perspective view of signal via 100D according to one embodiment of the present subject matter. In the figure, a pair of vias, 125D and 125E, are disposed in a region of dielectric 110D. Dielectric 110D is disposed in a bore of the interposer. In one embodiment, a bore is wholly or partially filled with dielectric 110D. In one embodiment, dielectric 110D includes two or more materials having different dielectric constants. In one embodiment, vias 125D and 125E are sufficiently close that performance, at high frequencies, can be modeled using TEM principals.

Connector pad 115D, on via 125D, and connector pad 115E, on via 125E, are each aligned concentrically. In one embodiment, a connector pad is aligned eccentrically relative to an axis of the via.

Dielectric 110D, in one embodiment, is disposed in a region between the paired vias through the interposer. In one embodiment, dielectric 110D extends beyond the region between the paired vias. In FIG. 5, dielectric 110D is disposed in a cylindrical region extending beyond the region between the paired vias.

Figure 6:
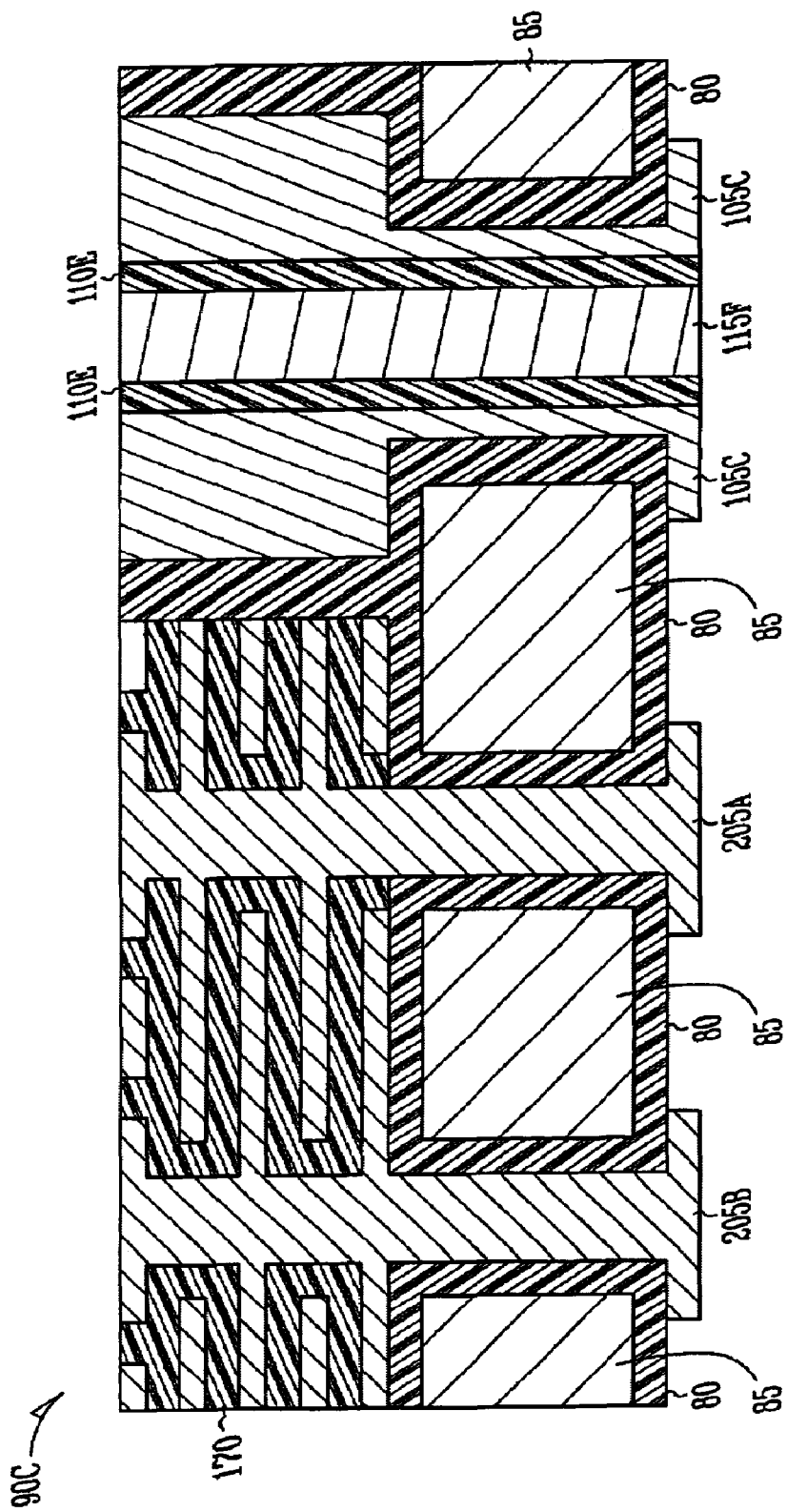
FIG. 6 includes a cross-sectional view of a portion of an interposer according to one embodiment.

FIG. 6 illustrates a cross-section view of interposer 90C. In the figure, interposer 90C includes conductive substrate 85 and three dielectrics. Conductive substrate 85, in one embodiment, includes a conductive material or metallic substrate such as copper (Cu), nickel (Ni) or iron-nickel (Fe—Ni). Via 205B, via 205A and via 105C are electrically isolated from conductive substrate 85 by insulator layer 80. In one embodiment, insulator layer 80 (dielectric) includes an oxide. Exemplary oxides include silicon dioxide, amorphous silicon oxide, nickel oxide, copper oxide and iron-nickel oxide. Via 205B and via 205A are conductive through vias that provide power delivery. Dielectric 170, disposed between conductive plates electrically coupled to via 205B and via 205A, includes a high-k dielectric. Via 115F and via 105C are paired through vias with dielectric 110E disposed in the interspatial region. Dielectric 110E, in one embodiment, includes a low-k (low dielectric constant) insulator.

The connector pads of the present subject matter, in one embodiment, extend above a surface of the interposer. In one embodiment, the connector pads are flush with a surface of the interposer.

Figure 7:
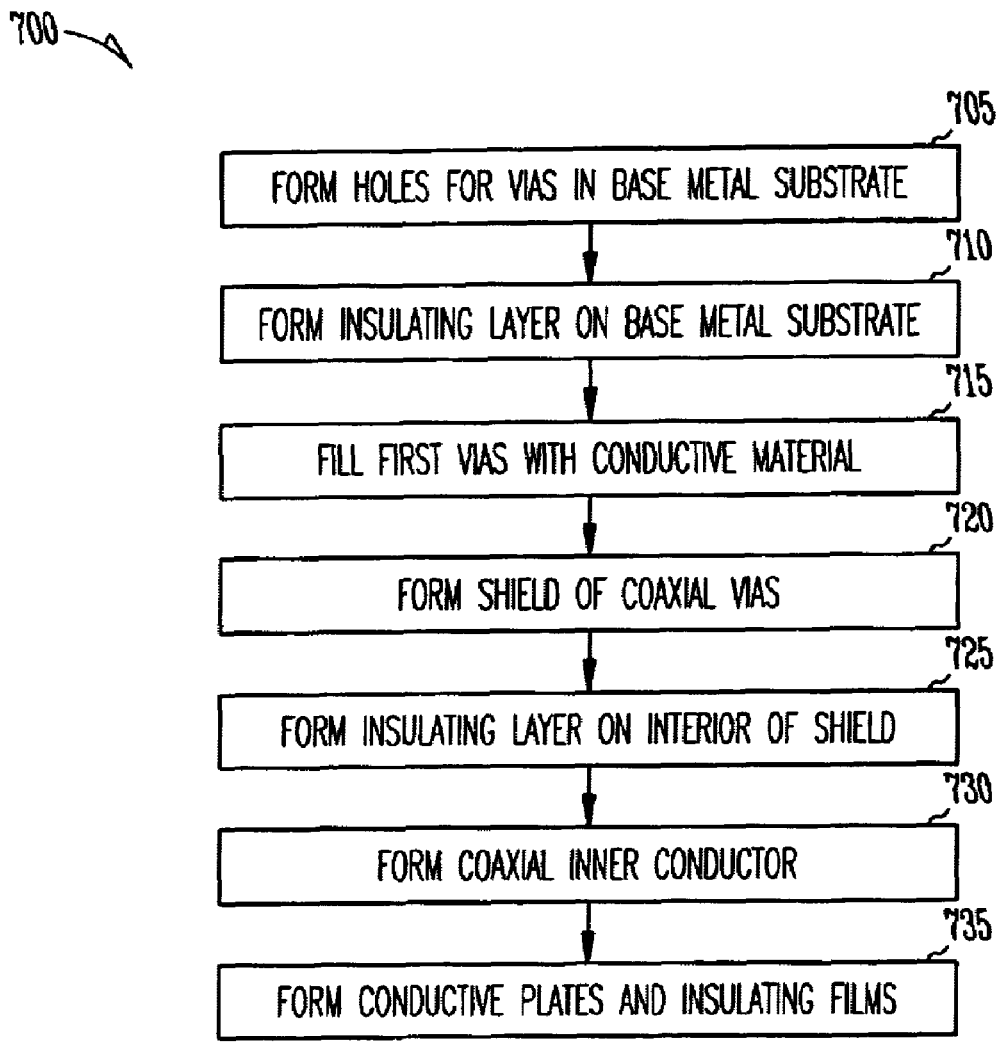
FIG. 7 includes a flow chart of one method of fabricating an embodiment of the present subject matter.

One method of fabricating an embodiment of the present subject matter is illustrated in the flow chart of FIG. 7. Method 700, in FIG. 7, corresponds to the cross section views of fabrication sequences illustrated in FIGS. 8A, 8B, 8C, 8D, 8E, 8F and 8G. The fabrication sequence figures illustrate a portion of an interposer having a single power delivery through via and a single pair of coaxial through vias.

Figure 8A:
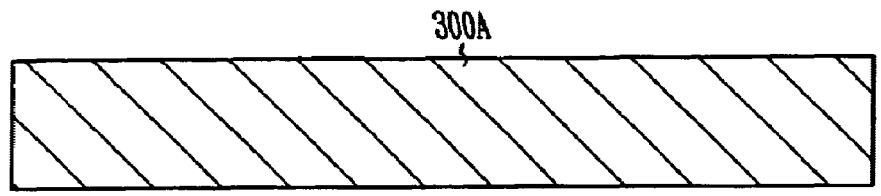
FIGS. 8A, 8B, 8C, 8D, 8E, 8F and 8G illustrate a sequence of fabrication steps for an embodiment of the present subject matter.
Figure 8B:
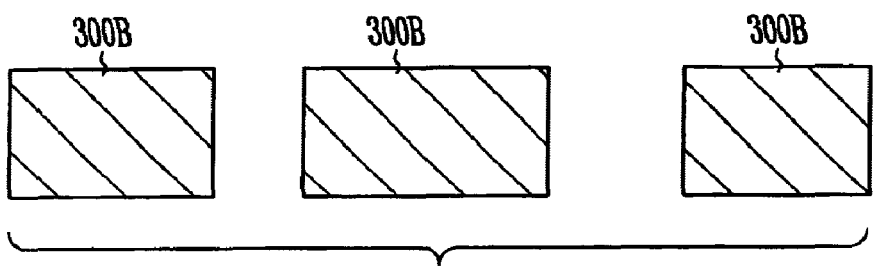

At 705 of FIG. 7, holes for vias are formed in a base metal substrate. Base metal substrate 300A is illustrated in FIG. 8A Base metal substrate 300A, in various embodiments, includes copper (Cu), nickel (Ni), iron-nickel (Fe—Ni) alloy or other conductive material. In various embodiments, holes are formed using laser drilling or wet-etching. Formed holes are illustrated in FIG. 8B with each segment of base metal substrate denoted as 300B.

Figure 8C:
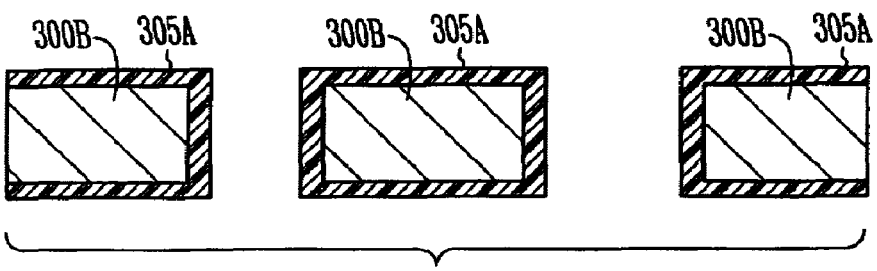

At 710 of FIG. 7, an insulating layer is formed on each segment of base metal substrate 300B. The insulating layer, according to one embodiment, includes an insulating oxide. In various embodiments, the insulating oxide is deposited or grown by processes including thermal oxidation, chemical vapor deposition (CVD), sol-gel or other methods. FIG. 8C illustrates insulating layer 305A formed on substrate 300B.

At 715 of FIG. 7, the first vias are formed by filling a hole with a conductive material. The conductive material, in one embodiment, is formed by plating, lithography, and etching. In various embodiments, seed deposition techniques include sputtering, metalorganic chemical vapor deposition (MOCVD) and electroless deposition. Following deposition, the conductive material is electroplated and etched according to a lithography pattern. Etching may include dry (plasma) etching or wet etching. At 720, a shield via, as part of the coaxial via, is formed by applying conductive material.

Figure 8D:
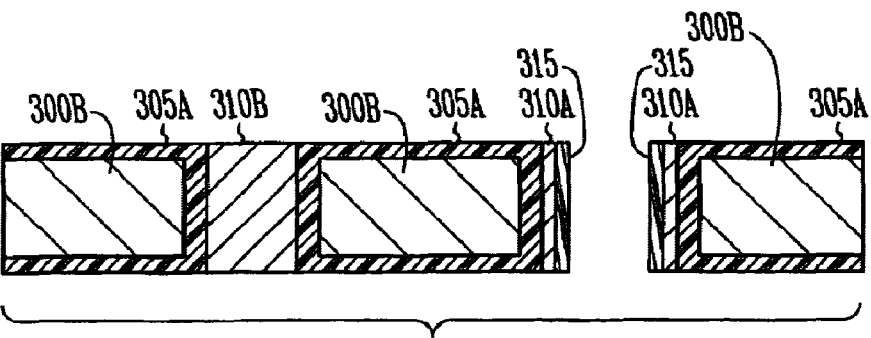

At 725 of FIG. 7, an insulating layer is formed on the interior of the shield via of the coaxial vias. The insulating layer, according to one embodiment, includes an insulating oxide and is formed by depositing or growing, using such processes as thermal oxidation, chemical vapor deposition (CVD), sol-gel or other methods. FIG. 8D illustrates first via 310B, shield via 310A and insulating layer 315 on the interior of shield via 310A.

Figure 8E:
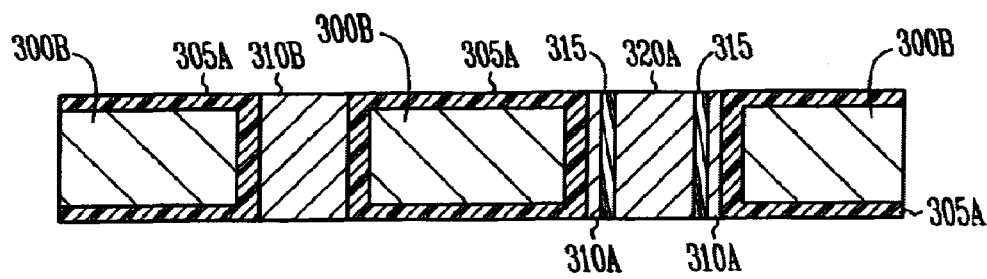

At 730 of FIG. 7, an inner via of the coaxial via is formed within a hole defined by insulating layer 315. The inner via is formed of a conductive material by plating, lithography or etching. FIG. 8E illustrates inner via 320A.

Figure 8F:
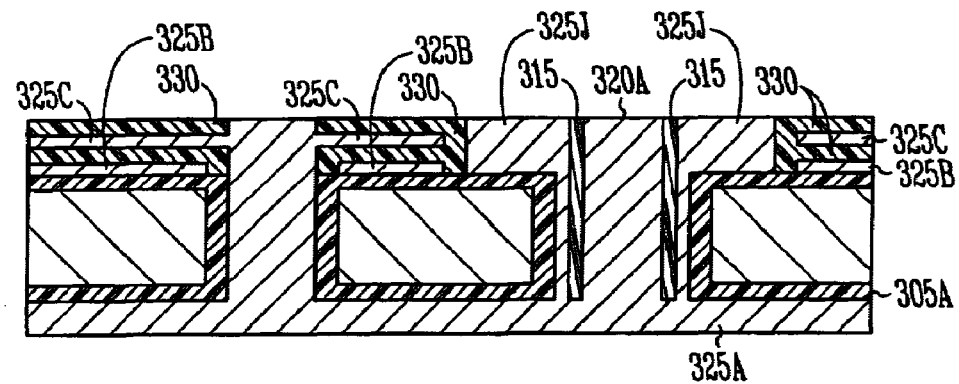
Figure 8G:
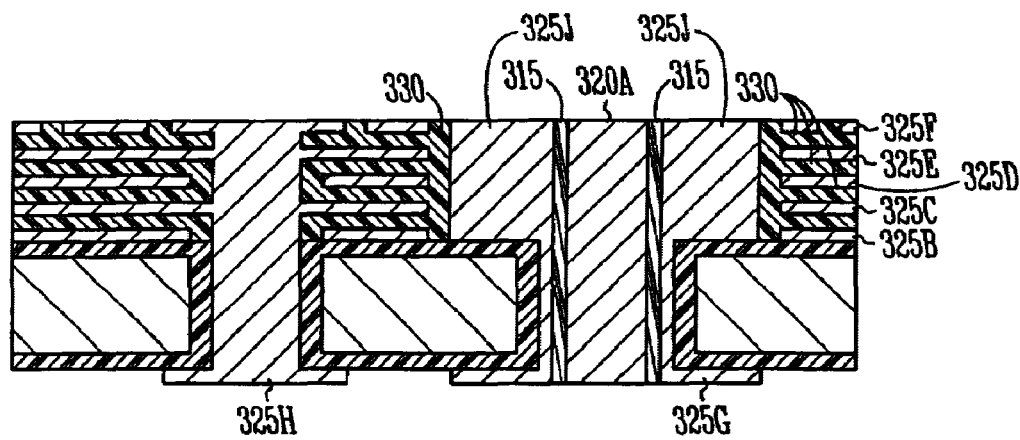

At 735 of FIG. 7, conductive plates separated by insulating films are formed. The metal plates, in one embodiment, are formed by plating, lithography and etching as described above. In FIG. 8F, a first conductive plate 325B is formed on insulating layer 305A. High-k film 330, of insulating ceramic, is formed on conductive plate 325B. High-k film 330, in one embodiment, is deposited by MOCVD, sputtering or sol-gel. After depositing, in one embodiment, the film is sintered in a reducing atmosphere (such as $N_2$, $CO/Co_2$ mixture, $H_2/H_2O$ mixture). In various embodiments, the film is patterned using lithography or etching. In FIG. 8F, a second conductive plate 325C is formed on high-k film 330. The formed shield via is designated 325J. FIGS. 8F and 8G illustrate fabrication of the metal plates of the capacitor. Connection pad 325G is formed on shield via 325J and connection pad 325H is formed on via 310B, as illustrated in the figures. In various embodiments, the connection pads are formed by etching a lithographed pattern or by polishing. In addition, a plating, lithography and etching process is used to extend the region of low-k dielectric to the surface of the connection pads.

CONCLUSION

The above description is intended to be illustrative, and not restrictive. Many other embodiments will be apparent to those of skill in the art upon reviewing the above description.

What is claimed is:
1. An apparatus comprising:
an array of electrically conductive first vias disposed through a substrate, each first via coupled to an alternate layer of a multi-layer capacitor and each layer separated by a high dielectric constant insulator, at least one first via having connector pads on an upper surface and on a lower surface of the substrate; and a pair of coaxially aligned electrically conductive second vias disposed through the substrate and separated by a low dielectric constant insulator.

2. The apparatus of claim 1 wherein the substrate includes an inorganic substrate.

3. The apparatus of claim 1 wherein the substrate includes a metal, glass, ceramic, a semiconductor or an oxide of silicon.

4. The apparatus of claim 1 wherein the first vias are copper filled.

5. The apparatus of claim 1 wherein the high dielectric constant is greater than the low dielectric constant by a factor greater than 25.

6. An apparatus comprising:
a substrate;
a first region having a first dielectric constant disposed between a plurality of conductive layers on the substrate including at least a first conductive layer coupled to at least a first via and at least a second conductive layer coupled to at least a second via;
a second region having second dielectric constant disposed between a coaxially aligned pair of adjacent further vias; and
wherein the first via, the second via and the pair of adjacent further vias are each electrically conductive, each is disposed in parallel alignment through the substrate, and at least one first via includes connector pads on an upper surface and on a lower surface of the substrate and wherein the first dielectric constant differs from the second dielectric constant.

7. The apparatus of claim 6 wherein the first dielectric constant is greater than the second dielectric constant.

8. The apparatus of claim 6 wherein the second region includes silica.

9. A system comprising:
a die having a plurality of signal pads and a plurality of power pads disposed on a surface;
an interposer having a plurality of through vias, wherein at least one through via includes connector pads on an upper surface and on a lower surface of the interposer, wherein a first group of the plurality of through vias are electrically coupled to the signal pads and a first region having a first dielectric constant separates coaxially aligned pairs of through vias of the first group and wherein a second group of the plurality of through vias are electrically coupled to the power pads and a plurality of capacitor plates and a second region having a second dielectric constant separates each capacitor plate, wherein the first dielectric constant differs from the second dielectric constant; and
a device coupled to the plurality of through vias.

10. The system of claim 9 wherein the first dielectric constant is lower than the second dielectric constant.

11. The system of claim 9 wherein the plurality of power pads are disposed in an array.

12. The system of claim 11 wherein the signal pads are disposed about the periphery of the array.

13. The system of claim 9 wherein the first region includes silica.

14. The system of claim 9 wherein the second region includes perovskite.

15. The system of claim 9 wherein the die is coupled to the interposer by a plurality of solder bumps.

16. An apparatus comprising:
a substrate;
a first group of through vias disposed in the substrate, wherein at least one through via of the first group includes connector pads on an upper surface and on a lower surface of the substrate, each via of the first group electrically coupled to a plurality of first conductive layers of a capacitor disposed on the substrate;
a second group of through vias disposed in the substrate, each via of the second group electrically coupled to a plurality of second conductive layers of the capacitor, each via of the second group electrically isolated from the plurality of first conductive layers;
a plurality of insulating layers electrically isolating each first conductive layer from an adjacent second conductive layer, the insulating layers having a first dielectric constant;
a third group of through vias disposed in the substrate and arranged in coaxially aligned pairs; and
an insulating region electrically separating each pair of the third group of through vias, the insulating region having a second dielectric constant different than the first dielectric constant.

17. The apparatus of claim 16 wherein the first group of through vias and the second group of through vias are arranged in a grid.

18. The apparatus of claim 16 wherein the third group of through vias are disposed about a periphery of the substrate.

19. The apparatus of claim 16 wherein the first dielectric constant is greater than the second dielectric constant.

* * * * *